(12) United States Patent
Lai et al.

(10) Patent No.: US 8,736,251 B2
(45) Date of Patent: May 27, 2014

(54) DIGITAL SENSING APPARATUS AND DIGITAL READOUT MODULE THEREOF

(75) Inventors: Kelvin Yi-Tse Lai, Changhua County (TW); Chen-Yi Lee, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 124 days.

(21) Appl. No.: 13/616,606

(22) Filed: Sep. 14, 2012

(65) Prior Publication Data

US 2013/0249615 A1 Sep. 26, 2013

(30) Foreign Application Priority Data

Mar. 23, 2012 (TW) .............................. 101110107 A

(51) Int. Cl.
| | | |
|---|---|---|
| *G01R 31/00* | (2006.01) | |
| *G01R 25/00* | (2006.01) | |
| *G01R 23/15* | (2006.01) | |
| *G01R 23/10* | (2006.01) | |
| *G01R 29/02* | (2006.01) | |
| *G01R 29/027* | (2006.01) | |
| *G01R 25/08* | (2006.01) | |

(52) U.S. Cl.
CPC .............. *G01R 23/15* (2013.01); *G01R 23/10* (2013.01); *G01R 29/023* (2013.01); *G01R 29/027* (2013.01); *G01R 25/08* (2013.01)
USPC ......................................... 324/76.48; 702/79

(58) Field of Classification Search
USPC .......... 324/76.48, 76.47, 76.41, 76.39, 76.11, 324/76.16, 76.62, 676, 710, 712, 76.55, 324/76.82; 702/79, 108, 116, 117, 124, 702/125, 126
See application file for complete search history.

(56) References Cited

U.S. PATENT DOCUMENTS

| 3,764,911 | A | * | 10/1973 | East | ............................... 368/118 |
| 3,953,803 | A | * | 4/1976 | Gallant et al. | ............. 324/76.11 |
| 4,562,549 | A | * | 12/1985 | Tanaka et al. | .................... 702/79 |
| 4,721,902 | A | * | 1/1988 | Tellerman et al. | .............. 73/610 |
| 7,952,343 | B2 | * | 5/2011 | Edwards | ..................... 324/76.11 |
| 2005/0253596 | A1 | | 11/2005 | Kitano et al. | |

FOREIGN PATENT DOCUMENTS

TW    I275808 B    3/2007

OTHER PUBLICATIONS

Kulah et al., A Multi-Step Electromechanical ΣΔ Converter for Micro-g Capacitive Accelerometers, IEEE International Solid State Circuits Conference, Session 11, Microsensors and Biomems, 11.6, Feb. 11, 2003.

Condemine et al., A 0.8mA 50Hz 15b SNDR ΔΣ Closed-Loop 10g Accelerometer Using an 8th-order Digital Compensator, IEEE International Solid State Circuits Conference, Session 13, Sensors, 13.6, Feb. 8, 2005.

(Continued)

*Primary Examiner* — Hoai-An D Nguyen
(74) *Attorney, Agent, or Firm* — Morgan, Lewis & Bockius LLP

(57) ABSTRACT

A digital sensing apparatus includes a sensing unit capable of providing a sensing response associated with an environmental parameter, and a digital readout module including a reading unit for generating a pulse signal having a pulse width associated with the sensing response, and a converting unit. The converting unit includes a clock signal generator for generating a variable-frequency clock signal, and a counter operable to count a width value of the pulse width of the pulse signal using the clock signal, so as to generate a digital sensing code. The frequency of the clock signal from the clock signal generator is adjustable to adjust resolution of the width value of the pulse width of the pulse signal.

24 Claims, 8 Drawing Sheets

(56) References Cited

OTHER PUBLICATIONS

Wu et al., A Low-Noise Low-Offset Chopper-Stabilized Capacitive-Readout Amplifier for CMOS MEMS Accelerometers, IEEE International Solid State Circuits Conference, Session 26, MEMS and Displays, 26.2, Feb. 6, 2002.

Analog Devices, CapTouch Programmable Controller for Single-Electrode Capacitance Sensors, AD7147, Rev. B, pp. 1-13, Jul. 2009.
Analog Devices, 24-Bit Capacitance-to-Digital Converter with Temperature Sensor, AD7745/AD7746, Rev. 0, pp. 1-25, Apr. 2005.

* cited by examiner

DIGITAL SENSING APPARATUS AND DIGITAL READOUT MODULE THEREOF

CROSS-REFERENCE TO RELATED APPLICATION

This application claims priority to Taiwanese Application No. 101110107, filed on Mar. 23, 2012.

BACKGROUND OF THE INVENTION

1. Field of the Invention

The invention relates to an apparatus and a module, and more particularly to a digital sensing apparatus and a digital readout module with an adjustable readout range.

2. Description of the Related Art

FIG. 1 shows a conventional sensing apparatus SA including a sensing element SE, a reading unit RU', and an analog-to-digital converter ADC.

The sensing element SE is configured to sense an environmental parameter and to generate a first characteristic parameter varying in a positive relation with the environmental parameter, and a second characteristic parameter varying in a negative relation with the environmental parameter.

The reading unit RU' is electrically coupled to the sensing element SE for receiving the first and second characteristic parameters, and generates a sensing voltage that varies in a positive relation with a difference between the first and second characteristic parameters.

The analog-to-digital converter ADC is electrically coupled to the reading unit RU' for receiving the sensing voltage therefrom, and is operable to perform an analog-to-digital conversion on the sensing voltage falling within a conversion range, so as to generate a digital sensing code associated with the environmental parameter.

In order to efficiently use all the bits of the analog-to-digital converter ADC, the upper and lower limits of the conversion range of the analog-to-digital converter ADC must correspond to the upper and lower limits of the sensing voltage produced by the reading unit RU', while the upper and lower limits of the sensing voltage correspond to a readout range of the sensing apparatus SA. If the environmental parameter sensed by the sensing apparatus SA is outside of the readout range, the digital sensing code generated by the sensing apparatus SA may have an error.

For illustration, the conventional sensing apparatus SA may be exemplified using an accelerometer. The conversion range of the analog-to-digital converter ADC ranges from 0V to 5V and is represented using 10 bits.

Referring to FIG. 2, the sensing element SE includes a central mass CM that is capable of producing a displacement associated with an applied acceleration, and left and right masses LM, RM that are immovable with respect to the environmental parameter and disposed at two opposite sides of the central mass CM. The masses LM, CM, and RM are electrical conductors, so as to form an equivalent left capacitor CL between the central mass CM and the left mass LM, and an equivalent right capacitor CR between the central mass CM and the right mass RM.

When acceleration is applied to the sensing element SE in the right direction, the central mass CM will move towards right, and the displacement value of the central mass CM during a unit time period is in a positive relation with magnitude of the acceleration applied thereto, such that the central mass CM becomes closer to the right mass RM and farther from the left mass LM, resulting in larger capacitance $C_R$ of the equivalent right capacitor CR (which is the first characteristic parameter) and smaller capacitance $C_L$ of the equivalent left capacitor CL (which is the second characteristic parameter).

The reading unit RU' is a capacitance-to-voltage converter that is capable of producing the sensing voltage varying in a positive relation with a difference $\Delta C$ between the capacitances $C_L$, $C_R$ of the equivalent left and right capacitors CL and CR ($\Delta C = C_L - C_R$ or $\Delta C = C_R - C_L$).

The analog-to-digital converter ADC is electrically coupled to the reading unit RU' for receiving the sensing voltage, and is operable to perform the analog-to-digital conversion on the sensing voltage falling within the conversion range (0~5V in this example), so as to generate the digital sensing code associated with the environmental parameter. When the sensed environmental parameter is equal to the lower limit of the readout range (for example: −2 g), the sensing voltage is 0V, and the digital sensing code is (0V/5V)×1023=0. When the sensed environmental parameter is equal to the upper limit of the readout range (for example: +2 g), the sensing voltage is 5V, and the digital sensing code is (5V/5V)×1023=1023.

However, when the sensed environmental parameter is +3 g, the sensing voltage obtained from the above calculation should be 6.25V, which exceeds the upper limit 5V of the conversion range, and the digital sensing code is not able to correctly correspond to the environmental parameter +3 g.

Therefore, the aforesaid conventional sensing apparatus has the following drawbacks:

1. The readout range is fixed, and the digital sensing code which ranges between 0 to $2^N-1$ from the N-bit analog-to-digital converter ADC corresponds to the readout range between the lower and upper limits. When the sensed environmental parameter exceeds the readout range, the generated digital sensing code may have errors.

2. The analog-to-digital converter ADC must perform conversion continuously, resulting in large power dissipation.

SUMMARY OF THE INVENTION

Therefore, an object of the present invention is to provide a digital sensing apparatus that can overcome at least one of the above drawbacks of the prior art.

According to one aspect of the present invention, a digital sensing apparatus comprises:

a sensing unit for sensing an environmental parameter and capable of providing a sensing response associated with the environmental parameter; and a digital readout module including:
  a reading unit coupled to the sensing unit for generating a pulse signal having a pulse width that is associated with the sensing response; and
  a converting unit including:
    a clock signal generator for generating a variable-frequency clock signal; and
    a counter coupled to the reading unit for receiving the pulse signal, and coupled to the clock signal generator for receiving the clock signal, the counter being operable to count a width value of the pulse width of the pulse signal using the clock signal, so as to generate a digital sensing code associated with the environmental parameter;

wherein the frequency of the clock signal from the clock signal generator is adjustable to adjust resolution of the width value of the pulse width of the pulse signal.

Another object of the present invention is to provide a digital readout module that can overcome at least one of the above drawbacks of the prior art.

According to another aspect of the present invention, a digital readout module is adapted for use with a sensing unit that is capable of sensing an environmental parameter and that provides a sensing response associated with the environmental parameter. The digital readout module comprises:

a reading unit to be coupled to the sensing unit for generating a pulse signal having a pulse width that is associated with the sensing response; and a converting unit including:
a clock signal generator for generating a variable-frequency clock signal; and
a counter coupled to the reading unit for receiving the pulse signal, and coupled to the clock signal generator for receiving the clock signal, the counter being operable to count a width value of the pulse width of the pulse signal using the clock signal, so as to generate a digital sensing code associated with the environmental parameter;

wherein the frequency of the clock signal from the clock signal generator is adjustable to adjust resolution of the width value of the pulse width of the pulse signal.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 3:
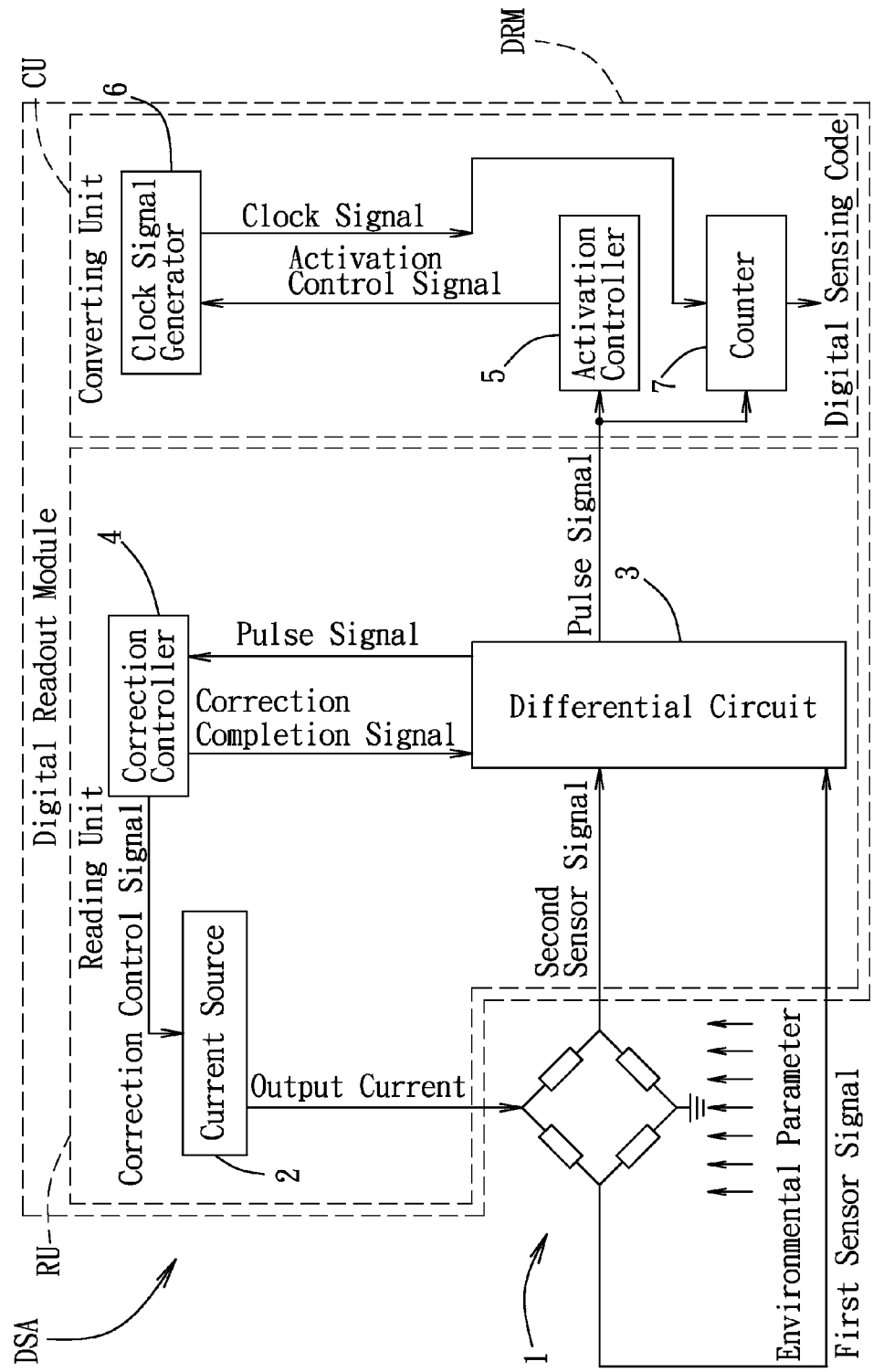
FIG. 3 is a block diagram showing a first or a third preferred embodiment of the digital sensing apparatus according to the present invention.

Referring to FIG. 3, the first preferred embodiment of the digital sensing apparatus DSA according to this invention is shown to include a sensing unit 1 and a digital readout module DRM.

The sensing unit 1 is adapted for sensing an environmental parameter and is capable of providing a sensing response associated with the environmental parameter. In this embodiment, the sensing response includes a first characteristic parameter that varies in a positive relation with the environmental parameter, and a second characteristic parameter that varies in a negative relation with the environmental parameter.

Referring to FIG. 4 to FIG. 7, equivalent circuits of first to fourth implementations of the sensing unit 1 are shown to include a first sensing element 11, a second sensing element 12, a first electrical element, and a second electrical element connected in a form of a bridge circuit.

Figure 4:
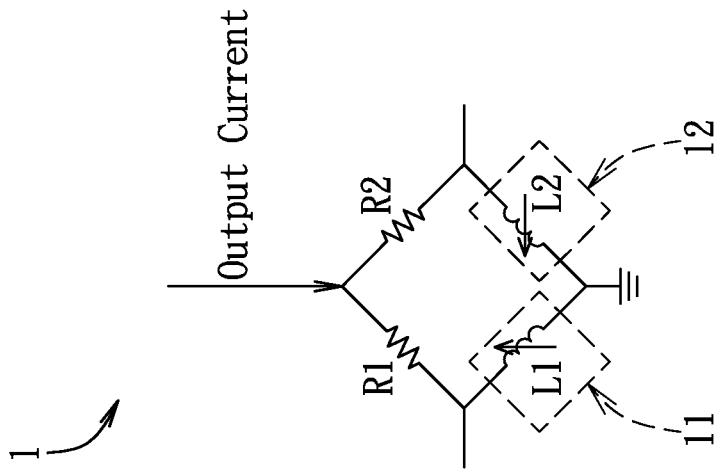
FIG. 4 to FIG. 7 are circuit diagrams showing equivalent circuits of first to fourth implementations of a sensing unit.

FIG. 4 shows the equivalent circuit of the first implementation of the sensing unit 1. In this implementation, the first sensing element 11 is a first variable capacitor C1 having a first connection terminal and a first grounded terminal. The first characteristic parameter is the capacitance of the first variable capacitor C1.

The second sensing element 12 is a second variable capacitor C2 having a second connection terminal and a second grounded terminal. The second characteristic parameter is the capacitance of the second variable capacitor C2.

The first electrical element is a first resistor R1 having a first input terminal for receiving a portion of an output current from the digital readout module DRM, and a third connection terminal coupled to the first connection terminal of the first variable capacitor C1 and from which a first sensor signal is obtained. The second electrical element is a second resistor R2 having a second input terminal for receiving another portion of the output current from the readout module DRM, and a fourth connection terminal coupled to the second connection terminal of the second capacitor C2 and from which a second sensor signal is obtained.

Figure 5:
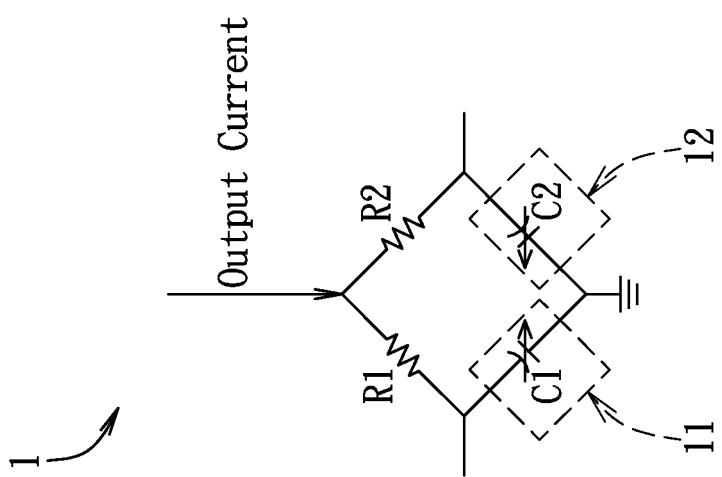

Referring to FIG. 5, the equivalent circuit of the second implementation of the sensing unit 1 is shown to be similar to the equivalent circuit of the first implementation of the sensing unit 1. This implementation differs from the first implementation in that the first sensing element 11 is a first variable inductor L1 and the second sensing element 12 is a second variable inductor L2. The first characteristic parameter is the inductance of the first variable inductor L1, and the second characteristic parameter is the inductance of the second variable inductor L2.

Figure 6:
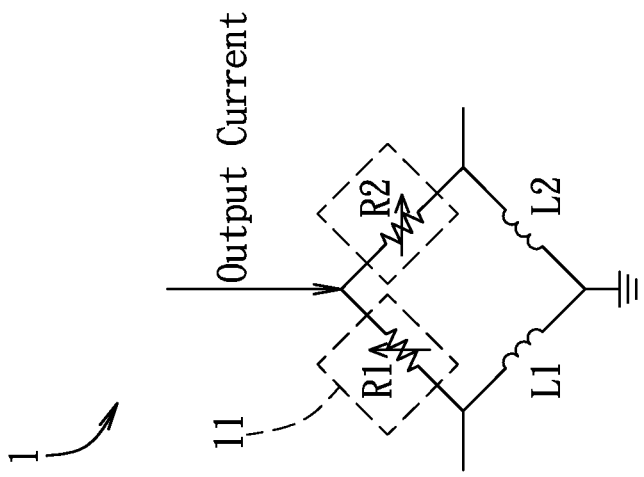

FIG. 6 shows the equivalent circuit of the third implementation of the sensing unit 1. In this implementation, the first sensing element 11 is a first variable resistor R1 having a first input terminal for receiving a portion of the output current from the digital readout module DRM, and a first connection terminal. The first characteristic parameter is the resistance of the first variable resistor R1.

The second sensing element 12 is a second variable resistor R2 having a second input terminal for receiving another portion of the output current from the digital readout module DRM, and a second connection terminal. The second characteristic parameter is the resistance of the second variable resistor R2.

The first electrical element is a first capacitor C1 having a first grounded terminal, and a third connection terminal coupled to the first connection terminal of the first variable resistor R1 and from which a first sensor signal is obtained. The second electrical element is a second capacitor C2 having a second grounded terminal, and a fourth connection terminal coupled to the second connection terminal of the second variable resistor R2 and from which a second sensor signal is obtained.

Figure 7:
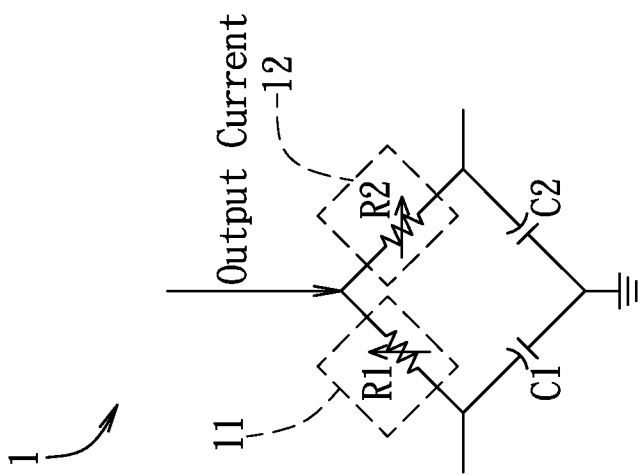

Referring to FIG. 7, the equivalent circuit of the fourth implementation of the sensing unit 1 is shown to be similar to the equivalent circuit of the third implementation of the sensing unit 1. This implementation differs from the third implementation in that the first electrical element is a first inductor L1 and the second electrical element is a second inductor L2.

Figure 1:
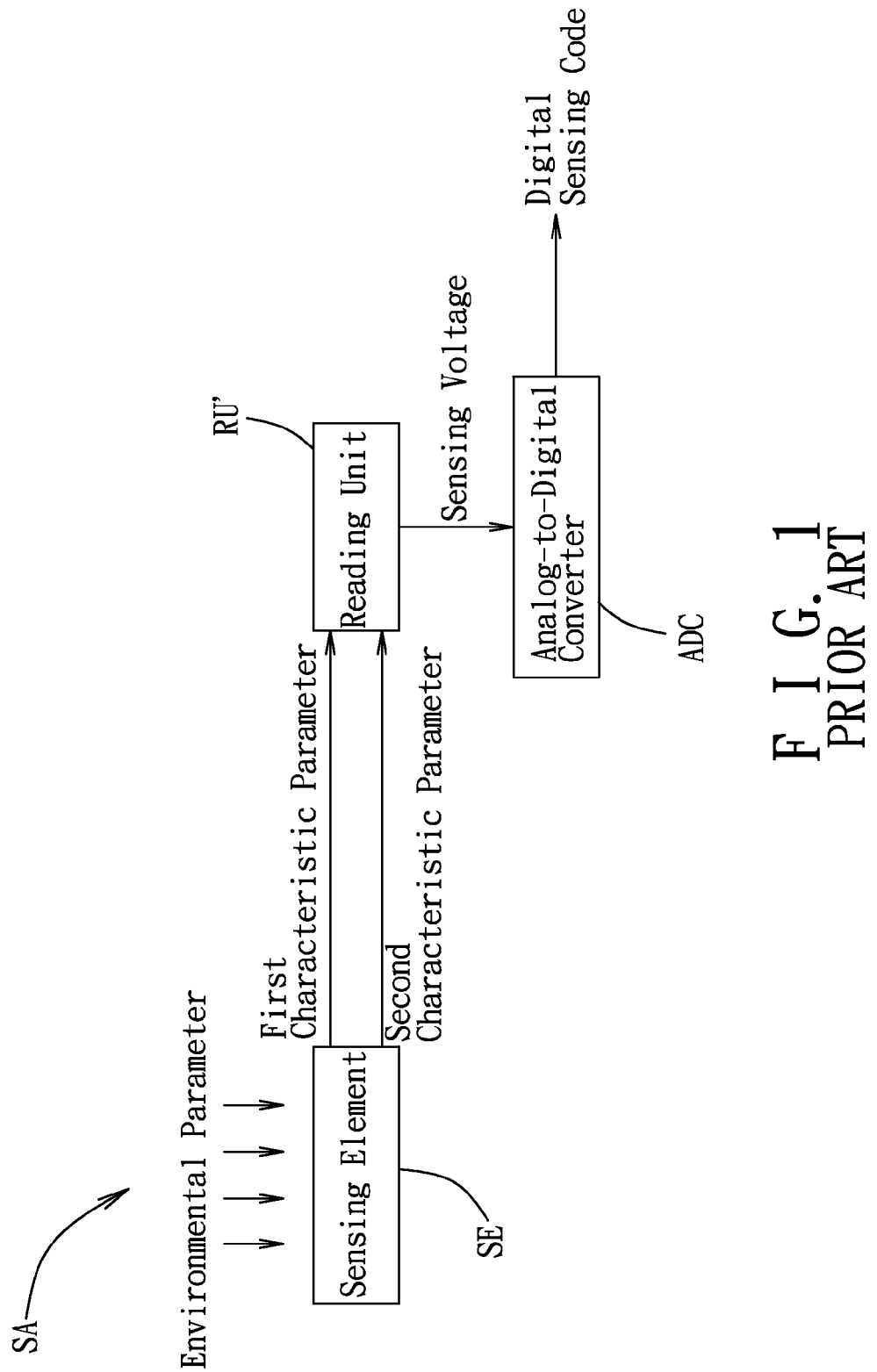
FIG. 1 is a block diagram of a conventional sensing apparatus.
Figure 2:
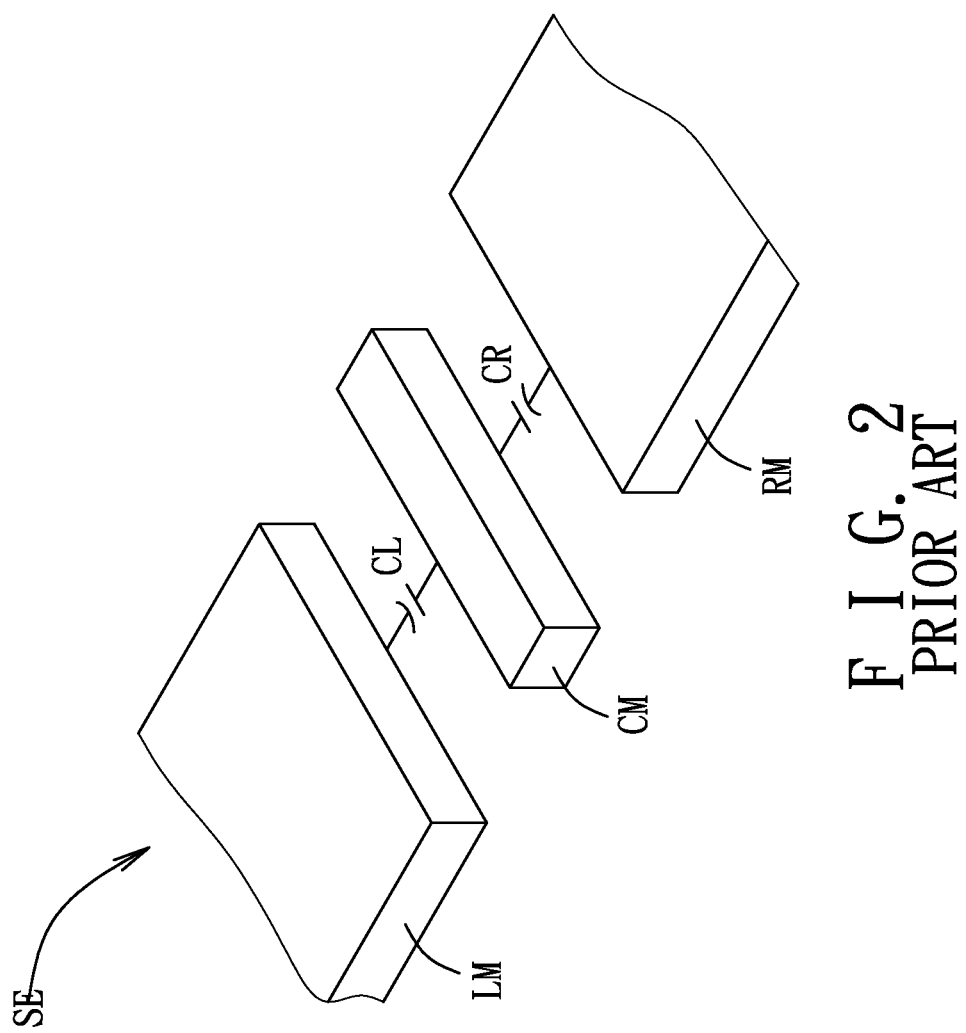
FIG. 2 is a schematic diagram showing a sensing element of the conventional sensing apparatus.

When the sensing unit 1 is configured to sense acceleration, the environmental parameter is the acceleration. Referring to FIG. 2, the first sensing unit 11 and the second sensing unit 12 are the left and right capacitors CL, CR, respectively. When magnitude of the acceleration is zero, the capacitances $C_L$, $C_R$ of the left and right capacitors CL, CR have initial values, respectively. When acceleration is applied to the sensing unit 1 in a right direction, the first characteristic parameter is the capacitance $C_R$ of the right capacitor CR, which varies in a positive relation with magnitude of the acceleration, and the second characteristic parameter is the capacitance $C_L$ of the left capacitor CL, which varies in a negative relation with magnitude of the acceleration. In other words, when magnitude of the acceleration is larger, the capacitance $C_R$ becomes larger, and the capacitance $C_L$ becomes smaller. Similarly, when the acceleration is applied to the sensing unit 1 in a left direction, the first characteristic parameter is the capacitance $C_L$ of the left capacitor CL, and the second characteristic parameter is the capacitance $C_R$ of the right capacitor CR.

Referring to FIG. 3, the digital readout module DRM is configured to generate a digital sensing code according to the sensing response from the sensing unit 1, and includes a reading unit RU and a converting unit CU.

The reading unit RU is coupled to the sensing unit 1 for generating a pulse signal having a pulse width that corresponds to a difference between the first and second characteristic parameters.

The reading unit RU includes a current source 2, a differential circuit 3, and a correction controller 4.

The current source 2 is coupled to the sensing unit 1 for providing the output current to the sensing unit 1, such that the sensing unit 1 is operable to generate a first sensor signal associated with the first characteristic parameter, and a second sensor signal associated with the second characteristic parameter. The current source 2 is configured to receive a correction control signal from the correction controller 4 and to adjust magnitude of the output current according to the correction control signal.

The differential circuit 3 is coupled to the sensing unit 1 for receiving the first and second sensor signals, and is operable to perform a logic operation on the first and second sensor signals to generate the pulse signal that is provided to the converting unit CU. In this embodiment, the logic operation is an XOR operation.

Figure 8:
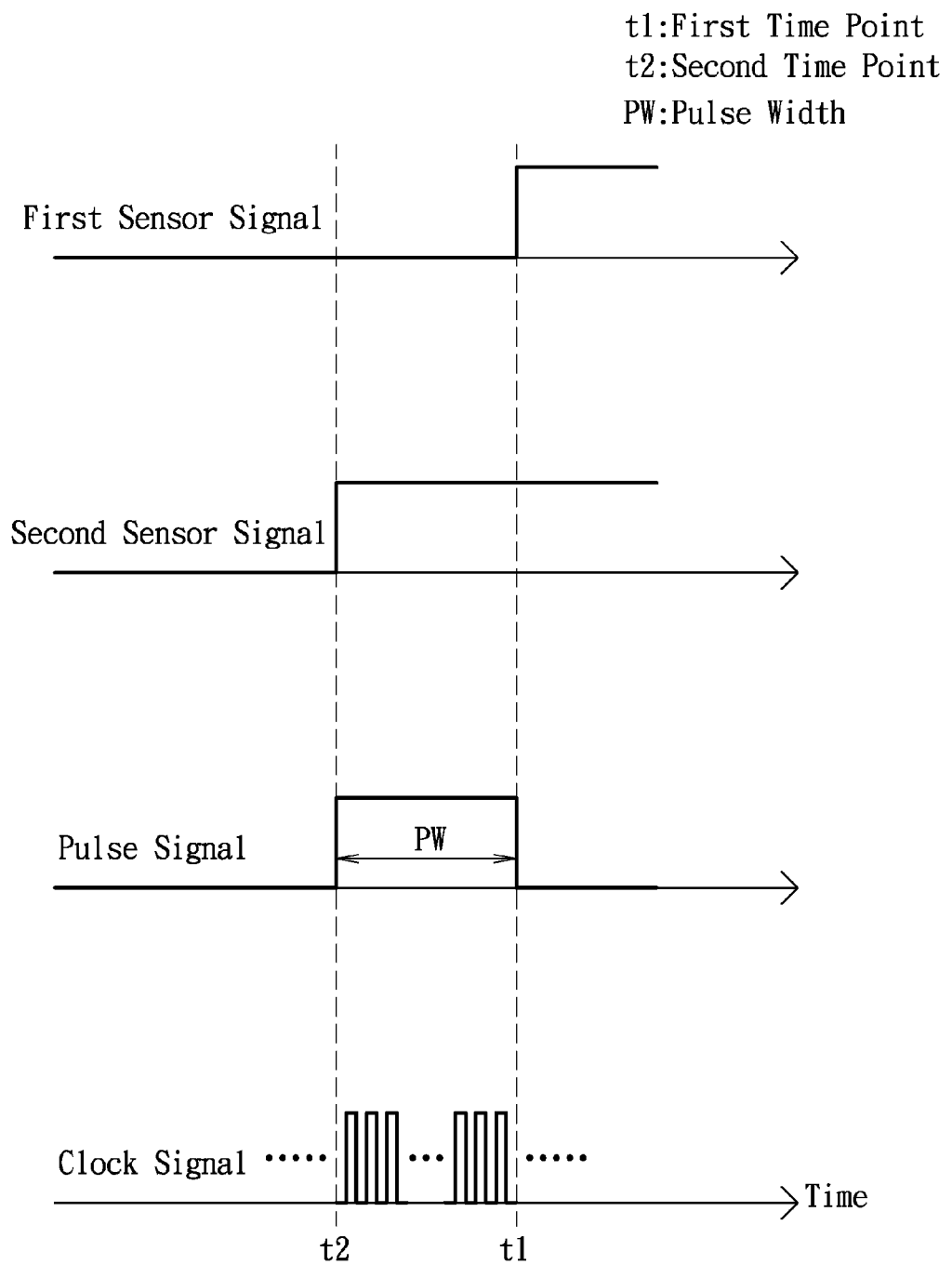
FIG. 8 is a timing diagram showing waveforms produced in the present invention.

Referring to FIG. 8, the first sensor signal has a rising edge at a first time point t1, and the second sensor signal has a rising edge at a second time point t2. The pulse width PW of the pulse signal is the difference between the first time point t1 and the second time point t2 (PW=Δt=t1−t2). When the environmental parameter is stable, each characteristic parameter of the sensing unit 1 is stable. When the output current is adjusted to be larger, the pulse width PW of the pulse signal becomes smaller. In this embodiment, the ratio k of the pulse width PW and the difference ΔS between the first and second characteristic parameters (k=ΔS/PW) is proportional to magnitude of the output current of the current source 2, and is adjustable from the current source 2.

However, due to differences attributed to manufacturing process, pressure, temperature, etc., the manufactured digital sensing apparatuses DSA may have unavoidable differences among each other. Even if magnitudes of the applied output currents and the sensed environmental parameter are the same, the pulse widths of the raw pulse signals from each digital sensing apparatus DSA may be different. The digital sensing apparatuses DSA that produce the pulse signal with a deviation outside of a tolerable range may have to be discarded, thereby increasing cost of production. In the first embodiment, the correction controller 4 is configured in the reading unit RU not only for correcting the deviation to solve the above issue, but also for adjusting the readout range through control of the output current of the current source 2, as shown in FIG. 3.

The correction controller 4 stores a correction value therein, and is coupled to the differential circuit 3 and the current source 2. The correction controller 4 receives the pulse signal from the differential circuit 3, and is operable to compare the pulse width of the pulse signal and the correction value and to generate one of the correction control signal and a correction completion signal based on result of comparison performed thereby. In detail, the correction controller 4 is operable to generate the correction control signal for increasing the output current of the current source 2 when the pulse width of the pulse signal is greater than the correction value, and is operable to generate the correction control signal for reducing the output current of the current source 2 when the pulse width of the pulse signal is less than the correction value. When the pulse width of the pulse signal is substantially equal to the correction value, the correction controller 4 generates the correction completion signal that is provided to the differential circuit 3, and the differential circuit 3 provides the pulse signal to the converting unit CU upon receipt of the correction completion signal.

During manufacture, the magnitude of the output current from the current source 2 may be continuously adjusted in a standard test environment based on the result of comparison between the pulse width of the pulse signal and the correction value until the pulse width is substantially equal to the correction value, and the correction completion signal is generated. Therefore, by application of the above process, differences among the digital sensing apparatuses DSA may be calibrated, and the generated pulse widths of the pulse signals may be substantially equal when the same environmental parameter is sensed.

The converting unit CU includes an activation controller 5, a clock signal generator 6, and a counter 7.

The activation controller 5 stores a preset activation threshold value therein, and is coupled to the reading unit RU for receiving the pulse signal. The activation controller 5 is operable to compare the pulse width of the pulse signal with the activation threshold value and to generate an activation control signal having a state based on result of comparison made thereby. When the pulse width of the pulse signal is greater than the activation threshold value, the activation controller 5 is operable to generate the activation control signal corresponding to an activate state. When the pulse width of the pulse signal is less than the activation threshold value, the activation controller 5 is operable to generate the activation control signal corresponding to a deactivate state.

The clock signal generator 6 is operable to generate a variable-frequency clock signal and is coupled to the activation controller 5 for receiving the activation control signal. The clock signal generator 6 outputs the clock signal when the state of the activation control signal corresponds to the activate state, and stops output of the clock signal when the state of the activation control signal corresponds to the deactivate state. Moreover, the variable-frequency clock signal may be used to calibrate errors of the clock signal resulting from the applied voltage, manufacturing process, or temperature.

The counter 7 is coupled to the reading unit RU for receiving the pulse signal, and is coupled to the clock signal generator 6 for receiving the clock signal. The counter 7 is operable to count a width value of the pulse width of the pulse signal using the clock signal, so as to generate the digital sensing code associated with the environmental parameter.

In application, the bit number of the digital sensing code is a fixed value, such as N bits, so that the full range of the pulse width of the pulse signal, which corresponds to the readout range of the sensing unit 1, must be represented using N bits. Therefore, the maximum pulse width of the pulse signal PWmax=$(2^N-1) \times T = \Delta Smax/k$, where T is the period of the clock signal. From the above descriptions, it is known that:

1. When the output current is predetermined, k is predetermined, so that when the frequency of the clock signal is adjusted to be lower, the readout range becomes larger, resulting in lower resolution. On the other hand, when the frequency of the clock signal is adjusted to be higher, the readout range becomes smaller, resulting in higher resolution.

2. When the period T is predetermined, the maximum pulse width of the pulse signal PWmax is fixed. However, the readout range can be adjusted through adjustment of the output current. Larger output current results in larger readout range and lower resolution, and smaller output current results in smaller readout range and higher resolution.

3. Only when the environmental parameter is greater than a specific value (that is, the pulse width of the pulse signal is greater than the activation threshold value), the clock signal generator 6 starts to oscillate to generate the clock signal, to thereby save power.

In each of the preferred embodiments of this invention, the definition of the resolution is the variation value of the environmental parameter per hertz (such as mg/Hz), and the definition of the readout range is the range of the environmental parameter that the digital sensing code can correctly indicate (such as −2 g~+2 g).

Figure 9:
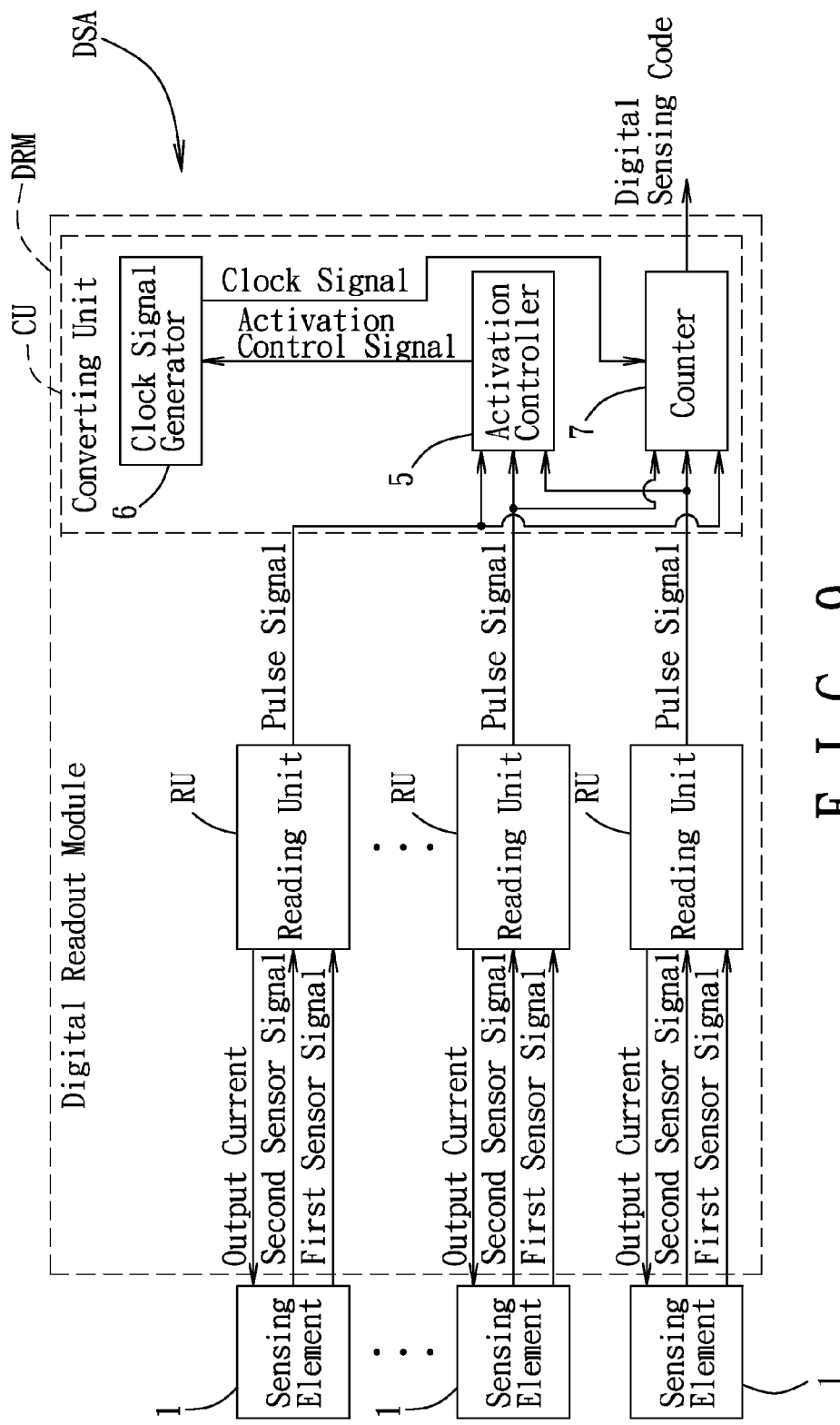
FIG. 9 is a block diagram showing a second preferred embodiment of the digital sensing apparatus according to the present invention.

Referring to FIG. 9, the second preferred embodiment of the digital sensing apparatus DSA according to this invention is shown to be similar to the first preferred embodiment. The main difference resides in that: the second preferred embodiment includes a plurality of the sensing units 1, a plurality of the reading units RU respectively coupled to the sensing units 1, and a converting unit CU coupled to the reading units RU. The activation controller 5 and the counter 7 of the converting unit CU sequentially receive the pulse signals from the reading units RU. It should be noted that the environmental parameters sensed and read by the sensing units 1 and the reading units RU may be different types, such as acceleration and temperature, or the same type from different sources, such as accelerations in X, Y, and Z directions.

Referring to FIG. 3, the third preferred embodiment of the digital sensing apparatus DSA according to this invention is shown to be similar to the first preferred embodiment. The main difference resides in that the second characteristic parameter of the second sensing element 12 is non-varying with respect to the environmental parameter. In other words, the second characteristic value is a predetermined value.

Figure 10:
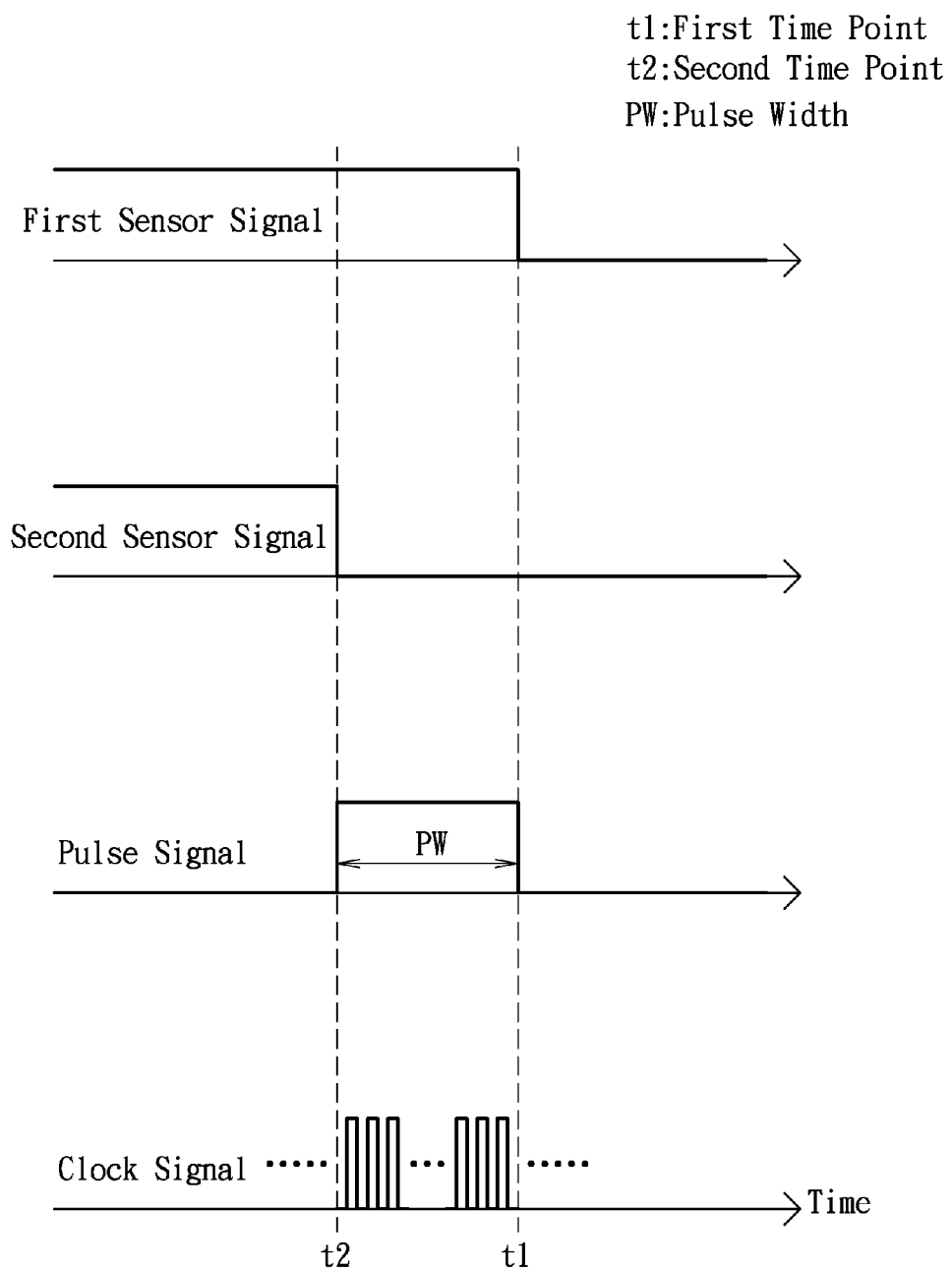
FIG. 10 is a timing diagram showing another set of waveforms produced in the present invention.

Referring to FIG. 3 and FIG. 10, since the sensing unit 1 includes capacitors or inductors, which are capable of both storing and releasing energy, the first and second sensor signals may have another form as shown in FIG. 10, and the converting unit CU is operable to generate the digital sensing code using the same operations described hereinabove.

To sum up, the present invention has the following advantages:

1. By adjusting the output current of the current source 2, or the frequency of the clock signal from the clock signal generator 6, the readout range of the digital sensing apparatus DSA is adjustable, so that it is not needed to produce various digital readout modules DRM and digital sensing apparatuses DSA for different applications.

2. The clock signal generator 6 will stop oscillation when the activation controller 5 determines that the pulse width of the pulse signal is less than the activation threshold value, to thereby save power.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A digital sensing apparatus comprising:
a sensing unit for sensing an environmental parameter and capable of providing a sensing response associated with the environmental parameter; and
a digital readout module including:
a reading unit coupled to said sensing unit for generating a pulse signal having a pulse width that is associated with the sensing response; and
a converting unit including:
a clock signal generator for generating a variable-frequency clock signal; and
a counter coupled to said reading unit for receiving the pulse signal, and coupled to said clock signal generator for receiving the clock signal, said counter being operable to count a width value of the pulse width of the pulse signal using the clock signal, so as to generate a digital sensing code associated with the environmental parameter;
wherein the frequency of the clock signal from said clock signal generator is adjustable to adjust resolution of the width value of the pulse width of the pulse signal.

2. The digital sensing apparatus as claimed in claim 1, wherein:
the sensing response includes a first characteristic parameter that varies in a positive relation with the environmental parameter, and a second characteristic parameter; and
said reading unit is operable to generate the pulse signal having the pulse width that corresponds to a difference between the first and second characteristic parameters.

3. The digital sensing apparatus as claimed in claim 2, wherein the second characteristic parameter varies in a negative relation with the environmental parameter.

4. The digital sensing apparatus as claimed in claim 2, wherein the second characteristic parameter is non-varying with respect to the environmental parameter.

5. The digital sensing apparatus as claimed in claim 2, wherein said reading unit includes:
a current source coupled to said sensing unit for providing an output current to said sensing unit, such that said sensing unit is operable to generate a first sensor signal associated with the first characteristic parameter, and a second sensor signal associated with the second characteristic parameter, said current source being configured to receive a correction control signal and to adjust magnitude of the output current according to the correction control signal; and
a differential circuit coupled to said sensing unit for receiving the first and second sensor signals, and operable to perform a logic operation on the first and second sensor signals to generate the pulse signal that is provided to said converting unit.

6. The digital sensing apparatus as claimed in claim 5, wherein the logic operation is an XOR operation.

7. The digital sensing apparatus as claimed in claim 5, wherein said reading unit further includes a correction controller storing a correction value therein, coupled to said differential circuit for receiving the pulse signal therefrom, and coupled to said current source for providing the correction control signal thereto;
said correction controller being operable to compare the pulse width of the pulse signal and the correction value and to generate one of the correction control signal and a correction completion signal based on result of comparison performed thereby;

said correction controller providing the correction completion signal to said differential circuit, and said differential circuit providing the pulse signal to said converting unit upon receipt of the correction completion signal.

8. The digital sensing apparatus as claimed in claim 7, wherein said correction controller is operable to generate the correction control signal for increasing the output current of said current source when the pulse width of the pulse signal is greater than the correction value, and is operable to generate the correction control signal for reducing the output current of said current source when the pulse width of the pulse signal is less than the correction value; and wherein said correction controller generates the correction completion signal when the pulse width of the pulse signal is substantially equal to the correction value.

9. The digital sensing apparatus as claimed in claim 2, wherein said sensing unit has an equivalent circuit that includes:

a first sensing element having the first characteristic parameter, said first sensing element having a first connection terminal and a first grounded terminal;

a second sensing element having the second characteristic parameter, said second sensing element having a second connection terminal and a second grounded terminal;

a first resistor having a first input terminal for receiving a portion of the output current from said current source, and a third connection terminal coupled to said first connection terminal of said first sensing element and from which the first sensor signal is obtained; and a second resistor having a second input terminal for receiving another portion of the output current from said current source, and a fourth connection terminal coupled to said second connection terminal of said second sensing element and from which the second sensor signal is obtained.

10. The digital sensing apparatus as claimed in claim 9, wherein said first sensing element is a variable capacitor, the first characteristic parameter being the capacitance of the first sensing element, said second sensing element being a capacitor, the second characteristic parameter being the capacitance of the second sensing element.

11. The digital sensing apparatus as claimed in claim 9, wherein said first sensing element is a variable inductor, the first characteristic parameter being the inductance of the first sensing element, said second sensing element being an inductor, the second characteristic parameter being the inductance of the second sensing element.

12. The digital sensing apparatus as claimed in claim 2, wherein said sensing unit has an equivalent circuit that includes:

a first sensing element having the first characteristic parameter and having a first input terminal for receiving a portion of the output current from said current source, and a first connection terminal;

a second sensing element having the second characteristic parameter and having a second input terminal for receiving another portion of the output current from said current source, and a second connection terminal;

a first electrical element having a first grounded terminal, and a third connection terminal coupled to said first connection terminal of said first sensing element and from which the first sensor signal is obtained; and a second electrical element having a second grounded terminal, and a fourth connection terminal coupled to said second connection terminal of said second sensing element and from which the second sensor signal is obtained;

wherein said first sensing element is a variable resistor, the first characteristic parameter being the resistance of the first sensing element, said second sensing element being a resistor, the second characteristic parameter being the resistance of the second sensing element.

13. The digital sensing apparatus as claimed in claim 12, wherein said first and second electrical elements are capacitors.

14. The digital sensing apparatus as claimed in claim 12, wherein said first and second electrical elements are inductors.

15. The digital sensing apparatus as claimed in claim 1, wherein said converting unit further includes an activation controller storing a preset activation threshold value therein, coupled to said reading unit for receiving the pulse signal, and operable to compare the pulse width of the pulse signal with the activation threshold value and to generate an activation control signal having a state based on result of comparison made thereby, said clock signal generator being further coupled to said activation controller for receiving the activation control signal, said clock signal generator outputting the clock signal when the state of the activation control signal corresponds to an activate state, and stopping output of the clock signal when the state of the activation control signal corresponds to a deactivate state.

16. The digital sensing apparatus as claimed in claim 15, wherein said activation controller is operable to generate the activation control signal corresponding to the activate state when the pulse width of the pulse signal is greater than the activation threshold value, and to generate the activation control signal corresponding to the deactivate state when the pulse width of the pulse signal is less than the activation threshold value.

17. A digital readout module adapted for use with a sensing unit that is capable of sensing an environmental parameter and that provides a sensing response associated with the environmental parameter, said digital readout module comprising:

a reading unit to be coupled to the sensing unit for generating a pulse signal having a pulse width that is associated with the sensing response; and a converting unit including:

a clock signal generator for generating a variable-frequency clock signal; and a counter coupled to said reading unit for receiving the pulse signal, and coupled to said clock signal generator for receiving the clock signal, said counter being operable to count a width value of the pulse width of the pulse signal using the clock signal, so as to generate a digital sensing code associated with the environmental parameter;

wherein the frequency of the clock signal from said clock signal generator is adjustable to adjust resolution of the width value of the pulse width of the pulse signal.

18. The digital readout module as claimed in claim 17, the sensing response provided by the sensing unit including a first characteristic parameter that varies in a positive relation with the environmental parameter, and a second characteristic parameter, wherein:

said reading unit is operable to generate the pulse signal having the pulse width that corresponds to a difference between the first and second characteristic parameters.

19. The digital readout module as claimed in claim 18, wherein said reading unit includes:

a current source to be coupled to the sensing unit for providing an output current to the sensing unit, such that the sensing unit is operable to generate a first sensor signal associated with the first characteristic parameter, and a second sensor signal associated with the second characteristic parameter, said current source being configured to receive a correction control signal and to adjust magnitude of the output current according to the correction control signal; and a differential circuit to be coupled to the sensing unit for receiving the first and second sensor signals, and operable to perform a logic operation on the first and second sensor signals to generate the pulse signal that is provided to said converting unit.

20. The digital readout module as claimed in claim 19, wherein the logic operation is an XOR operation.

21. The digital readout module as claimed in claim 19, wherein said reading unit further includes a correction controller storing a correction value therein, coupled to said differential circuit for receiving the pulse signal therefrom, and coupled to said current source for providing the correction control signal thereto;

said correction controller being operable to compare the pulse width of the pulse signal and the correction value and to generate one of the correction control signal and a correction completion signal based on result of comparison performed thereby;

said correction controller providing the correction completion signal to said differential circuit, and said differential circuit providing the pulse signal to said converting unit upon receipt of the correction completion signal.

22. The digital readout module as claimed in claim 21, wherein said correction controller is operable to generate the correction control signal for increasing the output current of said current source when the pulse width of the pulse signal is greater than the correction value, and is operable to generate the correction control signal for reducing the output current of said current source when the pulse width of the pulse signal is less than the correction value; and wherein said correction controller generates the correction completion signal when the pulse width of the pulse signal is substantially equal to the correction value.

23. The digital readout module as claimed in claim 17, wherein said converting unit further includes an activation controller storing a preset activation threshold value therein, coupled to said reading unit for receiving the pulse signal, and operable to compare the pulse width of the pulse signal with the activation threshold value and to generate an activation control signal having a state based on result of comparison made thereby, said clock signal generator being further coupled to said activation controller for receiving the activation control signal, said clock signal generator outputting the clock signal when the state of the activation control signal corresponds to an activate state, and stopping output of the clock signal when the state of the activation control signal corresponds to a deactivate state.

24. The digital readout module as claimed in claim 23, wherein said activation controller is operable to generate the activation control signal corresponding to the activate state when the pulse width of the pulse signal is greater than the activation threshold value, and to generate the activation control signal corresponding to the deactivate state when the pulse width of the pulse signal is less than the activation threshold value.

* * * * *